(12) United States Patent
Tatzel

(10) Patent No.: US 10,658,780 B2
(45) Date of Patent: May 19, 2020

(54) CONTACT SYSTEM AND CONTACT MODULE

(71) Applicant: Rosenberger Hochfrequenztechnik GmbH & Co. KG, Fridolfing (DE)

(72) Inventor: Frank Tatzel, Ostermiething (AT)

(73) Assignee: ROSENBERGER HOCHFREQUENZTECHNIK GMBH, Fridolfing (DE)

( * ) Notice: Subject to any disclaimer, the term of this patent is extended or adjusted under 35 U.S.C. 154(b) by 0 days.

(21) Appl. No.: 16/079,489

(22) PCT Filed: Oct. 9, 2017

(86) PCT No.: PCT/EP2017/075670
§ 371 (c)(1),
(2) Date: Aug. 23, 2018

(87) PCT Pub. No.: WO2018/086809
PCT Pub. Date: May 17, 2018

(65) Prior Publication Data
US 2019/0067857 A1    Feb. 28, 2019

(30) Foreign Application Priority Data

Nov. 10, 2016   (DE) .......................... 10 2016 013 412

(51) Int. Cl.
*H01R 12/00*   (2006.01)
*H01R 13/24*   (2006.01)
*G01R 1/067*   (2006.01)

(52) U.S. Cl.
CPC ..... *H01R 13/2407* (2013.01); *G01R 1/06716* (2013.01); *G01R 1/06783* (2013.01); *H01R 2201/20* (2013.01)

(58) Field of Classification Search
CPC ............ H01R 13/2407; H01R 2201/20; G01R 1/06783; G01R 1/06716; F16D 35/022
(Continued)

(56) References Cited

U.S. PATENT DOCUMENTS 3,263,923 A * 8/1966 Gladstone ................ F24F 11/00
236/1 C
4,566,806 A * 1/1986 DeBondt ................... B28B 7/42
374/45
(Continued)

FOREIGN PATENT DOCUMENTS

| CN | 1106955 A | 8/1995 |
|---|---|---|
| DE | 2905175 A1 | 8/1980 |
| DE | 3016483 A1 | 11/1981 |
| GB | 1316108 A | 5/1973 |

*Primary Examiner* — Jean F Duverne
(74) *Attorney, Agent, or Firm* — David P. Dickerson

(57) ABSTRACT

A contact system (100; 100'; 100") contains at least one pneumatically activated contact pin (121, 122, 123), a pressure chamber (1) and a first leadthrough (37; 37') which is in each case provided for each contact pin (121, 122, 123) in a housing (2) of the pressure chamber (1). Each contact pin (121, 122, 123) in each case has a first portion (141) with a first outer diameter and a second portion (142) which adjoins the first portion (141) and has a second outer diameter which is larger than the first outer diameter. Each first leadthrough (37; 37') has a first portion (131; 131') which faces away from the pressure chamber (1) and has a first inner diameter, and a second portion (132; 132') which faces the pressure chamber (1) and has a second inner diameter which is larger than the first inner diameter. The second portion (142) of each contact pin (121, 122, 123) is guided in an axially movable manner in the second portion (132; 132') of the first leadthrough (37; 37'). For the contact connection, the first portion (141) of the contact pin (121, 122, 123) is led through in the first portion (131; 131') of the first leadthrough (37; 37'). A certain axial position of each (Continued)

contact pin (121, 122, 123) in the associated first lead-through (37; 37') corresponds to a certain pressure level of a pressure medium in the pressure chamber (1). The pressure medium is temperature-controlled.

20 Claims, 9 Drawing Sheets

(58) Field of Classification Search
USPC .......................................................... 439/66
See application file for complete search history.

(56) References Cited

U.S. PATENT DOCUMENTS

| | | | | |
|---|---|---|---|---|
| 4,882,908 | A | * | 11/1989 | White ..................... F25B 13/00 |
| | | | | 62/155 |
| 5,324,205 | A | | 6/1994 | Ahmad et al. |
| 5,573,421 | A | | 11/1996 | Reichle |
| 5,701,985 | A | * | 12/1997 | Martin .................. F16D 35/022 |
| | | | | 192/58.681 |
| 5,762,504 | A | | 6/1998 | Itoh |
| 6,624,645 | B2 | | 9/2003 | Haseyama et al. |
| 7,555,834 | B2 | | 7/2009 | Perugini |
| 2010/0182029 | A1 | | 7/2010 | Sekino |
| 2016/0118210 | A1 | | 4/2016 | Beroz |
| 2018/0272587 | A1 | * | 9/2018 | Galati ................. B29C 45/7613 |
| 2019/0275719 | A1 | * | 9/2019 | de Oliveira Antunes ................... |
| | | | | B29C 45/03 |

* cited by examiner

CONTACT SYSTEM AND CONTACT MODULE

FIELD OF THE INVENTION

The present invention relates to a contact system of at least one contact pin with which an individual contact point or a grid of contact points can be made contact with in order in each case to detect and to transmit at least one electric signal. In addition, the present invention also relates to an individual contact module with a contact pin.

TECHNICAL BACKGROUND

A multiplicity of contact systems is known from the prior art. The contact systems can essentially be divided into three groups according to the design of their contact pins:
- contact systems with spring contact pins, as are disclosed, for example, in U.S. Pat. No. 6,624,645 B2,
- contact systems with lever arms, as are described, for example, in U.S. Pat. No. 7,555,834 B2, and
- contact systems with buckling bars, as emerge, for example, from U.S. Pat. No. 5,324,205 A1.

The contact points to be made contact with by the contact system can be arranged in this connection in various standardized configurations on the housing of an integrated circuit, such as, for example, Ball-Grid-Array (BGA) or Quad-Flat-No-Leads-Package (QFN).

A common feature of all of these contact pins is that the spring force or prestressing force required for the contact connection is produced by elastic deformation of a component (spiral spring in the case of the spring contact pin) or of the entire contact pin (lever arm or buckling bar). In order to achieve the requirements regarding the contact force, the spring travel and the stability in a certain use of the elastic contact pin, with the laws of structural mechanics being taken into consideration a relatively large overall size for the elastic contact pin is produced under some circumstances.

This brings a plurality of disadvantages:

The electrical adaptation of the contact pin to the entire measurement system, which adaptation is required for the reflection-minimized transmission of high-frequency signals and is typically already difficult to bring about if made additionally even more difficult by the lengthening of the contact pin. This has a disadvantageous effect on the signal integrity of the high-frequency signal to be transmitted.

In addition, a different contact force arises for each point of the spring travel. This non-linearity of the elastic contact pin has a particularly disadvantageous effect if axial tolerances, for example in the event of an oblique position, in the event of wear or planarity tolerances of the contact surface grid, have to be compensated for.

Ageing-induced fluctuations in the spring force because of, for example, the relaxation of the elastic contact pin can be compensated for only with a large outlay, if at all.

If the contact force of the elastic contact pin is intended to be adapted, for example in the case of sensitive contact points, in high-current applications or in the event of oxidized contact points, this is likewise only possible with difficulty, if at all.

Semiconductor components are frequently tested under extreme temperature conditions, for example in burn-in tests. In these cases, the elastic contact pins are frequently exposed to very high or very low temperatures, and therefore they act as heat conductors and undesirably dissipate heat from the measurement object or supply heat to the measurement object.

This is a state which is worth improving.

SUMMARY OF THE INVENTION

Against this background, the present invention is based on the object of specifying a contact module containing a contact pin, and a contact system which contains at least one contact pin, which both overcome the abovementioned disadvantages.

This object is addressed by the embodiments recited in the independent claims. Further embodiments are recited in the dependent claims.

For this purpose, the contact system according to the invention contains at least one pneumatically activated contact pin, a pressure chamber and a first leadthrough which is in each case provided for each contact pin in the housing of the pressure chamber.

Leadthrough is understood here and below as meaning an opening between the pressure chamber and the exterior space of the pressure chamber within the housing of the pressure chamber. The leadthrough here essentially has a certain longitudinal extent and a certain cross-sectional profile or a progression of the cross-sectional profile along the longitudinal extent. In addition to the longitudinal extent, the leadthrough can optionally also have a transverse extent adjoining the longitudinal extent and/or an additional extent adjoining the longitudinal extent or transverse extent and oriented at any angle with respect to the longitudinal extent.

The individual first leadthrough has a first portion which faces away from the pressure chamber and has a first inner diameter, and a second portion which faces the pressure chamber and has a second inner diameter which is larger than the first inner diameter.

The first portion of the contact pin has a first outer diameter, while the second portion of the contact pin has a second outer diameter which is larger than the first outer diameter and which corresponds to the inner diameter of the second portion of the first leadthrough.

The second portion of the contact pin is guided in an axially movable manner in the second portion of the first leadthrough, and, for the contact connection, the first portion of the contact pin is led through in the first portion of the first leadthrough.

The axial position of each contact pin in the associated first leadthrough corresponds to a pressure level of a pressure medium in the pressure chamber.

Owing to the fact that the outer diameter of the contact pin and the inner diameter of the first leadthrough are increased from the first portion of the contact pin or from the first portion of the first leadthrough to the second portion of the contact pin or to the second portion of the first leadthrough, at a certain axial position of the contact pin within the first leadthrough a certain cavity is formed between the inner wall of the second portion of the first leadthrough, the cylinder outer lateral surface of the first portion of the contact pin, that end surface of the second portion of the contact pin which faces away from the pressure chamber and that end surface of the first portion of the first leadthrough which faces the pressure chamber. Located in said cavity is air with a certain compressibility which, during the axial movement of the contact pin in the direction of the exterior space of the pressure chamber, exerts a damping effect on the axially moving contact pin. An elastic contact pin can thereby be advantageously replaced by a rigid contact pin. It is also advantageously possible to avoid the spiral spring, which is customarily used in a pneumatically activated contact pin, for providing damping of the contact pin.

For the targeted temperature control of the contact pin, in order to prevent heat flowing into or out from the temperature-controlled housing of the integrated circuit, which is to be tested, via the contact pin, according to the invention the pressure medium in the pressure chamber is temperature-controlled. The contact pin which is connected to the pressure medium of the pressure chamber therefore takes on the temperature of the pressure medium by means of heat transfer or heat convection. When the temperature of the pressure medium is equalized to the temperature of the housing, heat supply or heat removal via the contact pin is therefore prevented.

In order to realize the temperature control of the contact pin by means of heat transfer not only in the region in which the contact pin is directly connected within the pressure chamber to the pressure medium, but also over a greater longitudinal extent of the contact pin, in a preferred extension of the invention at least one air duct is provided within the contact pin, said air duct extending from that end of the contact pin which faces the pressure chamber over a certain longitudinal extent in the second portion of the contact pin. Each of said air ducts is referred to below as first air duct.

Said first air ducts are filled with the temperature-controlled pressure medium and preferably realize a more uniform and more rapid temperature control of the contact pin along the longitudinal extent of the at least one first air duct.

An air duct is understood here and below as meaning a cavity with a certain transverse profile and a certain progression within a mechanical component and/or between at least two mechanical components which are adjacent to each other.

In addition, air ducts are provided between the interior space of the second portion of the first leadthrough and the exterior space of the pressure chamber, said air ducts being referred to below as second air ducts.

The axial position of the individual second air ducts in the second portion of the first leadthrough and the longitudinal extent of the first air ducts in the associated contact pin are configured in such a manner that, in an axial position of the contact pin within a certain position region in the first leadthrough, there is a connection between each second air duct and at least one first air duct. The axial position of a contact pin within a certain position region results from different distances of the contact point, which is to be made contact with, on the housing of the integrated circuit, which is to be tested, from the contact system.

In this manner, an air exchange between the pressure chamber and the exterior space of the pressure chamber is realized in each case via the first and second air ducts, the air exchange controlling the temperature of the contact pin in an accelerated manner via heat convection to the temperature level of the pressure medium in the pressure chamber.

In a first embodiment of the invention, each first air duct is preferably in each case realized as a recess which runs in the longitudinal direction on the cylinder outer lateral surface of the second portion of the contact pin. Each of these recesses extends from the end of the contact pin, which faces the pressure chamber, over a certain longitudinal extent in the second portion of the contact pin.

In a preferred extension of the first embodiment of the invention, each recess in each case has a conical or frusto-conical profile at its end facing away from the pressure chamber. The contact pin is thereby centered in the first leadthrough by the identically sized air volume flowing in each case in each first air duct.

In a second embodiment of the invention, each first air duct is in each case realized as a first bore, which is common to each first air duct, in the longitudinal direction of the second portion of the contact pin within the contact pin and an adjoining second bore running in the transverse direction with respect to the second portion of the contact pin. The first bore likewise extends from that end of the contact pin which faces the pressure chamber over a certain longitudinal extent in the second portion of the contact pin.

In a first variant of the contact system according to the invention, the first leadthrough in each case associated with each contact pin is in each case realized as a stepped throughbore in the housing of the pressure chamber, said stepped throughbore having a first portion with a first inner diameter and a second portion with a second inner diameter. In respect of good axial guidance of the contact pin, which is moved axially within the first leadthrough, a partial portion of a first sleeve is fixed in a precisely fitting manner in a partial portion of the second portion of the stepped throughbore. For this purpose, the contact pin is guided in an axially movable manner with the second portion in the first sleeve. The advantage of the first variant can be seen in that the first sleeve is constructed and therefore manufacturable comparatively simply.

In a second variant of the contact system according to the invention, the first leadthrough in each case associated with each contact pin is realized as an interior space of a first sleeve which is fixed in a precisely fitting manner in an associated throughbore in the housing of the pressure chamber. The first sleeve has in turn a first portion with the first inner diameter and a second portion with the second inner diameter. The advantage of the second variant resides in that the first sleeve and the contact pin connecting therein can be produced as a separable contact module which can be installed comparatively simply into the housing of the pressure chamber.

In both variants of the contact system according to the invention, at least one opening is provided in that partial portion of the second portion of the first sleeve which is located in the pressure chamber. Said partial portion of the second portion of the first sleeve is at the same time left free from the associated contact pin. A direct connection between the pressure medium located in the pressure chamber and that end of the contact pin which points to the pressure chamber is thereby possible.

For the electrical connection of the contact point, which is to be made contact with by the contact pin, to a printed circuit board, a signal line is fastened to the contact pin or to the first sleeve.

For better fixing of the first sleeve and therefore of the associated contact pin in the housing of the pressure chamber, that end of the first sleeve which is remote from the associated contact pin is preferably in each case fixed in a precisely fitting manner in a third leadthrough in the housing of the pressure chamber.

In respect of a contact connection of a coaxial contact connection on an integrated circuit, each contact pin of the contact system is extended by a contact socket arranged coaxially with respect to the respective contact pin. For this purpose, an insulator part and a second leadthrough, which is arranged coaxially on the latter and in which the contact socket is movable axially, are provided around the respective contact pin.

In addition to a contact system according to the invention which contains at least one contact pin, preferably a plurality of contact pins, the invention also covers an individual contact module according to the invention which contains a first sleeve and a contact pin which is movable axially therein and is pneumatically activatable. The features of the first sleeve and of the contact pin correspond here to the corresponding features in the contact system according to the invention.

The above refinements and developments can be combined with one another, as desired, to the extent expedient. Further possible refinements, developments and implementations of the invention also comprise not explicitly mentioned combinations of features of the invention described previously or below with regard to the exemplary embodiments. In particular, the person skilled in the art will also add individual aspects here as improvements or as a supplement to the respective basic form of the present invention.

SUMMARY OF THE DRAWING

The present invention is explained in more detail below with reference to the exemplary embodiments which are indicated in the schematic figures of the drawing, in which.

Figure 1A:
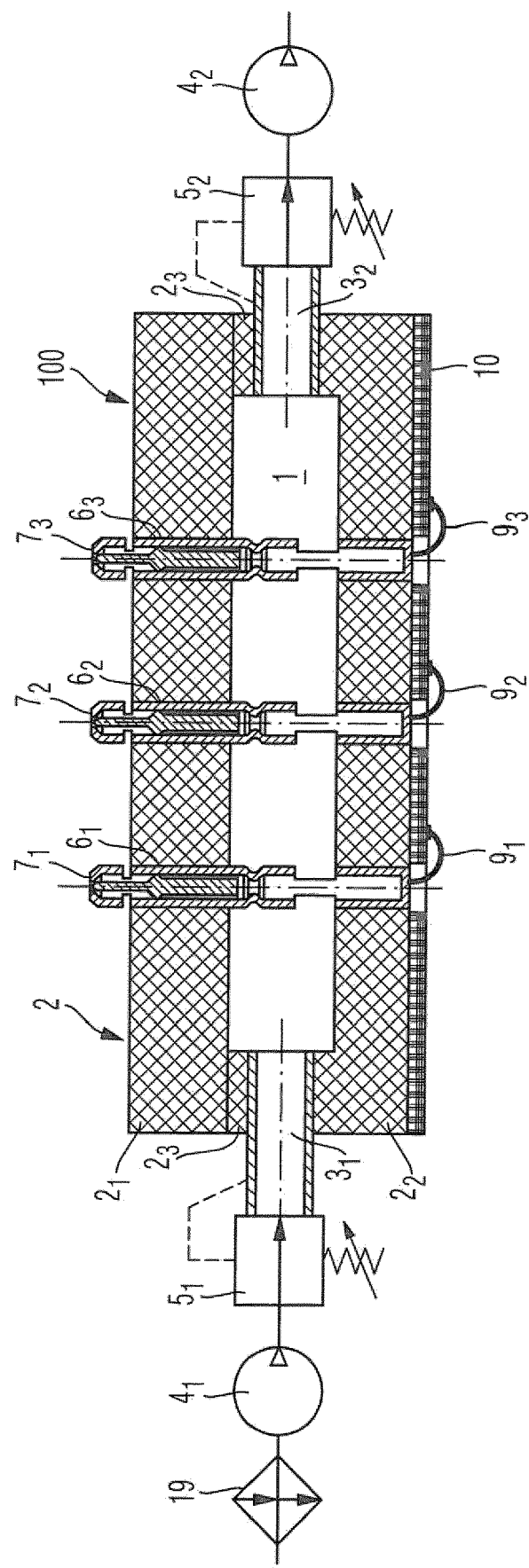
FIG. 1A shows a sectional illustration of an embodiment of a contact system according to the invention with contact pin retracted.

The accompanying figures of the drawing are intended to provide further understanding of the embodiments of the invention. They illustrate embodiments and, in conjunction with the description, serve to explain principles and concepts of the invention. Other embodiments and many of the advantages mentioned become apparent with respect to the drawings. The elements of the drawings are not necessarily shown true to scale in relation to one another.

In the figures of the drawing, identical, functionally identical and identically acting elements, features and components are in each case provided with the same reference signs—unless stated otherwise.

The figures are described below in a coherent and comprehensive manner.

DESCRIPTION OF EXEMPLARY EMBODIMENTS

A first embodiment of a contact system 100 according to the invention is explained in detail below with reference to FIGS. 1A and 1B.

The contact system according to the invention has a pressure chamber 1 which is closed, preferably in a pressure-tight manner, by a housing 2. In a simple realization, the housing 2 has an upper plate 21 and a lower plate 22 which are spaced apart at a certain distance from each other via connecting webs 23.

The realization of the housing 2 from two plates spaced apart from each other is suitable for applications in which the individual contact pins of the contact system are arranged on a single surface for the contact connection and testing of a single integrated circuit.

However, the invention also covers housing forms in which a plurality of plates in a certain orientation with respect to one another form a housing surface and each contain contact pins. With a housing having more than two plates, a plurality of integrated circuits can be made contact with and tested simultaneously.

The material used for the housing 2 and its individual parts is preferably an electrically insulating material having a certain mechanical load-bearing capacity.

In the case of a preferred housing 2 having two parallel plates 21 and 22, a first inlet 31 and a second inlet 32 are in each case provided between the webs 23. Via the first inlet 31, the pressure chamber 1 is supplied with a certain volume of pressure medium, for example air, via a first pressure control valve 51 by a first pneumatic pump 41 in order to set a certain first or second pressure level, in particular a pressure level which is increased in comparison to the exterior space of the pressure chamber 1. A temperature controller 19 which controls the temperature of the pressure medium to a certain temperature level is connected in series with the first pneumatic pump 41 and with the first pressure control valve 51.

A second inlet 32 is optionally provided, via which a certain volume of pressure medium is removed from the pressure chamber 1 by means of a second pneumatic pump 42 and a second pressure control valve 52 in order to adjust a certain second pressure level, in particular a pressure level which is reduced in comparison to the exterior space of the pressure chamber, i.e. a negative pressure level.

Figure 1B:
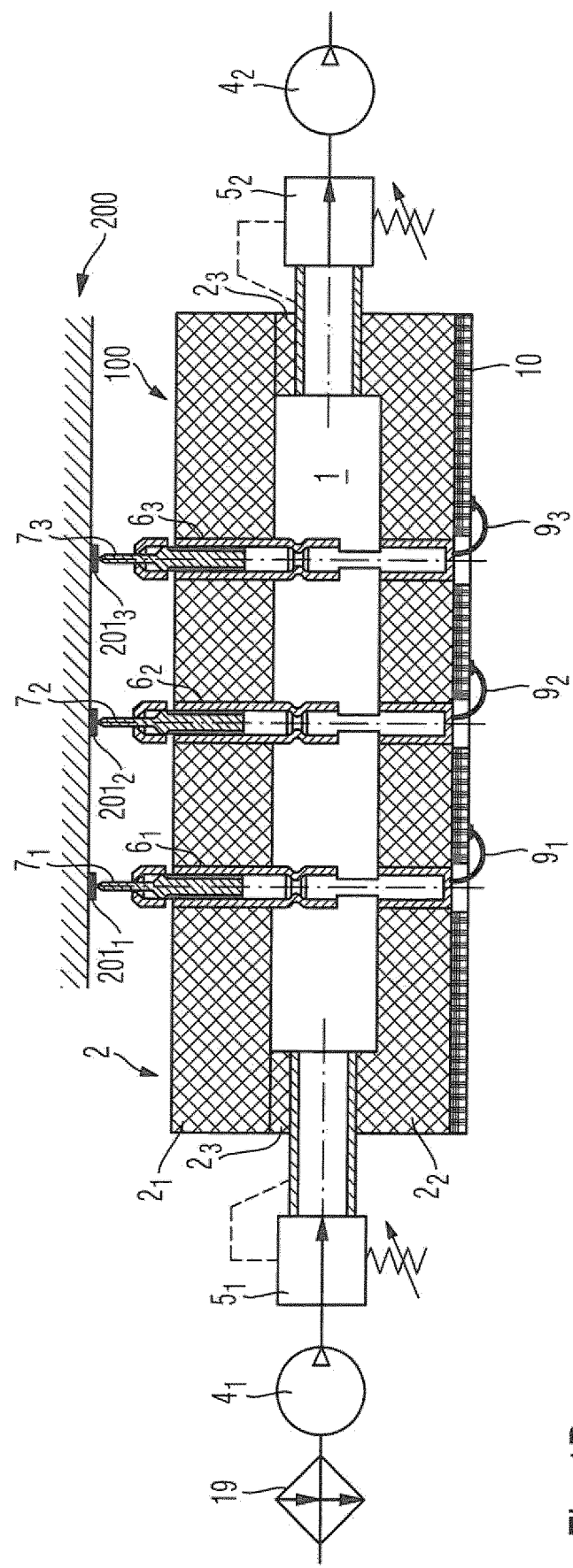
FIG. 1B shows a sectional illustration of an embodiment of a contact system according to the invention with contact pin extended.

The housing 2 of the pressure chamber 1 has at least one first throughbore 61, 62 and 63, preferably a plurality of throughbores, which, in the realizations in FIGS. 1A and 1B, are each arranged in the upper plate 21 of the housing 2. A first embodiment of a contact module 71, 72 and 73 is fixed in a precisely fitting manner in one of said throughbores 61, 62 and 63 each. Said contact modules 71, 72 and 73 are additionally fixed in a precisely fitting manner in second throughbores 81, 82 and 83 lying opposite the first throughbores 61, 62 and 63 in the housing 2, i.e. in the realization in FIGS. 1A and 1B, in each case in the lower plate 22 of the housing 2. This serves for additionally stabilizing the contact modules 71, 72 and 73 in the housing 2 of the pressure chamber 1.

Signal lines 91, 92 and 93, for example wires, cables and other transmission elements, which each lead to contact points or contact surfaces on a printed circuit board 10, are each fastened to the ends of the contact modules 71, 72 and 73 by means of soldering, bonding, welding and other connection technologies. Said printed circuit board 10 is fastened directly to the lower plate 22 of the housing 2.

Alternatively, the printed circuit board 10 can also be integrated in a measurement device positioned remotely from the pressure chamber 1.

FIG. 1A illustrates the contact pins 121, 122 and 123 in each case in the retracted state, i.e. in the non-contacting state. FIG. 1B illustrates the contact pins 121, 122 and 123 in the extended state in which they make contact with associated contact points 2011, 2012 and 2013 of a housing 200 of the integrated circuit to be tested.

The first embodiment of the contact module 7 according to the invention is explained in detail with reference to the enlarged illustration in FIGS. 2A and 2B:

The first embodiment of the contact module 7 according to the invention contains a first sleeve 11 which is fixed in each case in a precisely fitting manner in one of the first throughbores 61, 62 and 63 in the plate 21 of the housing 2 that is in each case the upper plate according to FIGS. 1A and 1B and in an associated second throughbore 81, 82 and 83 in the plate 22 of the housing 2 that is in each case the lower plate according to FIGS. 1A and 1B.

A contact pin 12 is guided in an axially movable manner in the interior space of the first sleeve 11, which interior space serves as the first leadthrough 37. The first leadthrough 37, i.e. the interior space of the first sleeve 11, comprises a first portion 131 which faces away from the pressure chamber 1 and serves as a passage for a first portion 141 of the contact pin in the contact connection state, and a second portion 132 which faces the pressure chamber 1, adjoins the first portion 131 and in which a second portion 142 of the contact pin, which portion adjoins the first portion 141, is guided in an axially movable manner.

The first inner diameter of the first sleeve 11 in the region of the first portion 131 of the first leadthrough 37 is preferably somewhat larger than the first outer diameter of the first portion 141 of the contact pin 12 in order to guarantee that the contact pin 12 slides through the inner bore of the first sleeve 11 in the region of the first portion 131 of the first leadthrough 37 without obstruction or without friction.

The second inner diameter of the first sleeve 11, i.e. the inner diameter of the first leadthrough 37, in the region of the second portion 132 of the first leadthrough 37 corresponds to the second outer diameter of the second portion 142 of the contact pin 12 in order to prevent pressure medium from escaping from the pressure chamber 1 into the exterior space of the pressure chamber 1 at the beginning of the buildup of pressure in the pressure chamber 1.

A cavity is formed between the inner wall of the first sleeve 11 in the region of the second portion 132 of the first leadthrough 37, the first portion 141 of the contact pin 12, that end surface of the first portion 131 of the first sleeve 11 which faces the pressure chamber, in the transition between the first and the second portion of the first leadthrough 37, and that end surface of the second portion 142 of the contact pin 12 which faces away from the pressure chamber. Said cavity is filled with compressible air. During an axial movement of the contact pin 12 within the first sleeve 11 in the direction of the housing, with which contact is to be made, of the integrated circuit, which is to be tested, the air located in the cavity is additionally compressed. The air therefore acts on the contact pin 12 as a damping element. The contact system according to the invention therefore does not require a spiral spring as a damping element, as is used according to the prior art in other contact systems with pneumatic activation of the contact pins.

Above a certain compression of the air in the cavity as the axial movement of the contact pin 12 in the first sleeve 11 increases, the air in the intermediate space between the first sleeve 11 in the region of the first portion 131 of the first leadthrough 37 and the first portion 141 of the contact pin 12 can escape into the exterior space of the pressure chamber 1.

In the region of the second portion 132 of the first leadthrough 37, preferably in the partial portion of the second portion 132 of the first leadthrough 37, which partial portion is located in the pressure chamber 1, the first sleeve 11 has a radially inwardly directed shoulder 15 which serves as a mechanical stop, facing the pressure chamber, for the contact pin 12.

That end surface of the first sleeve 11 which faces the pressure chamber, in the transition between the first and second portion of the first leadthrough 37, serves as a mechanical stop, which faces away from the pressure chamber, for the contact pin.

In the partial portion of the second portion 132 of the first leadthrough 37, which partial portion is located in the pressure chamber 1, the first sleeve 11 has at least one opening 16, preferably a plurality of openings, through which the pressure medium located in the pressure chamber can in each case pass into the interior space of the first sleeve 11 and therefore to that end 17 of the contact pin 12 which faces the pressure chamber. The contact pin 12 can therefore be positioned at a certain axial position within the first sleeve 11, which position corresponds to the pressure level of the pressure medium in the pressure chamber 1 and is referred to as the first axial position.

In this extended state, which is illustrated in FIG. 1B, the first portion 141 of each contact pin 121, 122 and 123 protrudes beyond the first sleeve 11 and makes contact by its associated test probe 18 with the associated contact point 2011, 2012 and 2013 on the housing 200 of the integrated circuit to be tested. This pressure level corresponds to a first pressure level which is set by the first pneumatic pump 41 and the first pressure control valve 51.

In the retracted state, which is illustrated in FIG. 1A, the individual contact pin 121, 122 and 123 is in an axial position within the first sleeve 11, which position is located closer to the pressure chamber 1 than the first axial position. This position is referred to as the second axial position. In said second axial position, the test probe 18 is no longer in contact with the associated contact point on the housing of the integrated circuit. The first portion 141 of the contact pin 12 can project here over the first portion 131 of the first leadthrough 37 or can be located within the first portion 131 or within the second portion 132 of the first leadthrough 37.

This pressure level corresponds to a second pressure level which, in a first case, is reduced in comparison to the first pressure level and is likewise set by the first pneumatic pump 41 and the first pressure control valve 51.

In a second case, the second pressure level corresponds to the pressure level in the exterior space of the pressure chamber 1 and is realized by switching off the first pneumatic pump 41 and/or by pressure control to ambient pressure level by the first pressure control valve 51. In the first and second case, the contact pin 12 returns from the first axial position into the second axial position because of gravity. In a third case, the second pressure level corresponds to a negative pressure level in relation to the ambient pressure level in the exterior space of the pressure chamber 1.

In the third case, a negative pressure level in relation to the ambient pressure level in the exterior space of the pressure chamber 1 is realized in the pressure chamber 1 by the second pneumatic pump 42 and the second pressure control valve 52. This third case is used in particular whenever the contact pin 12 because of its position with respect to the pressure chamber 1 is not subjected to gravity in the direction of the pressure chamber 1. This case exists, for example, if the contact pin is mounted in an axially movable manner horizontally with respect to the pressure chamber 1 in a first sleeve 11 in a side plate in the housing 2 or if said contact pin is mounted in an axially movable manner below the pressure chamber 1 in a first sleeve 11 in a lower plate 22.

That end 18 of the first sleeve 11 which is remote from the contact pin 12 is fixed in a precisely fitting manner preferably in a third leadthrough 8 in the housing 2, preferably in a housing plate 22 of the housing 2. In a preferred realization of this type, the end 18 of the first sleeve 11 is closed. A signal line 9 is fastened to this end 18 of the first sleeve 11 by means of the abovementioned connection technologies.

In an alternative realization, that end 36 of the first sleeve 11 which is remote from the contact pin 12 ends in the pressure chamber 1. A signal line 9 which, in this alternative realization, is fastened to the end 18 of the first sleeve 11 is guided via a sealed bore in the housing 2, which bore is not illustrated in all of the figures, into the exterior space of the pressure chamber 1 and connected to a contact point of a printed circuit board 10.

By that end 17 of the contact pin 12 which faces away from the test probe 18 being in direct contact with the temperature-controlled pressure medium of the pressure chamber 1, heat is transferred between the pressure medium of the pressure chamber 1 and the contact pin 12. In this manner, the temperature of the contact pin 12 can be equalized to the temperature level of the housing of the integrated circuit, which is to be tested, via temperature control of the pressure medium. An undesirable removal of heat from the housing of the integrated circuit to the contact pin 12 or an undesirable supply of heat from the contact pin 12 to the housing of the integrated circuit can therefore be advantageously avoided.

The integrated circuit or the housing of the integrated circuit therefore ideally remains at the test temperature which has been set. If the integrated circuit is tested in temperature cycles, as are carried out, for example, in the case of burn-in tests, the temperature controller 19 should be operated with the same temperature cycles in order to control the temperature of the pressure medium.

The contact pin 12 more rapidly follows the changed temperature level of the pressure medium in the pressure chamber 1 by at least one first air duct 201, 202, 203 and 204 being provided within the contact pin 12. Each of said first air ducts 201, 202, 203 and 204 extends in each case from that end 17 of the contact pin 12 which faces the pressure chamber over a certain longitudinal extent in the second portion 132 of the contact pin.

Figure 2A:
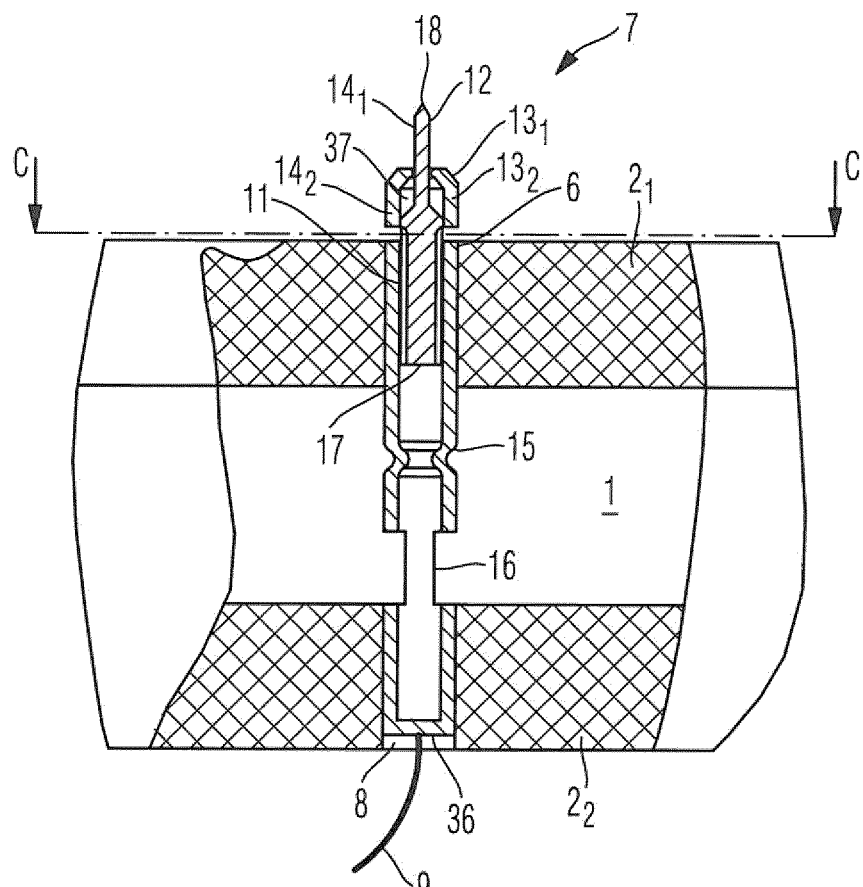
FIG. 2A shows a longitudinal sectional illustration of a first embodiment of a contact module according to the invention.
Figure 2B:
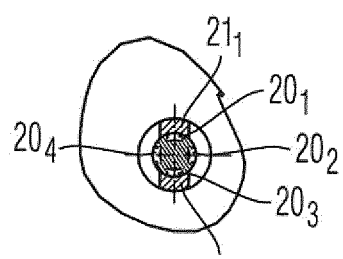
FIG. 2B shows a cross-sectional illustration of a first embodiment of a contact module according to the invention.

In the first embodiment, which is illustrated in FIGS. 2A and 2B, of a contact module 7 according to the invention, the individual first air ducts 201, 202, 203 and 204 are in each case realized as a recess on the cylinder outer lateral surface of the contact pin 12. Each recess is in each case closed by an inner wall of the first sleeve 11 in the region of the second portion 132 of the first leadthrough 37. The individual recesses of the first air ducts 201, 202, 203 and 204 are in each case preferably arranged at equidistant angular distances from one another.

A plurality of second air ducts 211 and 212 which are likewise arranged at equidistant angular portions from one another run between the second portion 132 of the first leadthrough 37, i.e. the interior space of the first sleeve 11 in the region of the second portion 132 of the first leadthrough 37, and the exterior space of the pressure chamber 1. The number of second air ducts 211 and 212 is reduced in comparison to the number of first air ducts 201, 202, 203 and 204. It is thereby ensured that, at each arbitrary orientation of the contact pin 12 within the first sleeve 11 and at a certain axial position of the contact pin 12 in the associated first sleeve 11, each second air duct 211 and 212 is at least partially connected to at least one of the first air ducts 201, 202, 203 and 204.

In this manner, there is at least a number of direct air connections between the pressure chamber 1 and the exterior space of the pressure chamber 1 corresponding to the number of second air ducts 211 and 212.

In the contacting state of the contact pin 12, the axial position of the contact pin 12 in the associated first sleeve 11 is dependent on the position of the housing of the integrated circuit with respect to the contact system and can vary over a certain region. Consequently, the longitudinal extent of each first air duct 201, 202, 203 and 204 in the second portion 142 of the contact pin 12 and the axial position of the second air ducts 211 and 212 through the first sleeve 11 in the second portion 132 of the first leadthrough 37 can be configured in such a manner that a direct connection is realized between each second air duct and at least one of the first air ducts. In particular, the longitudinal extent of each first air duct 201, 202, 203 and 204 in the second portion 142 of the contact pin 12 should be designed to be of a sufficient length.

By means of the direct air connection between the individual first air ducts 201, 202, 203 and 204 and the associated second air ducts 211 and 212, an air flow of the temperature-controlled pressure medium between the pressure chamber 1 and the exterior space of the pressure chamber 1 in each case occurs. Said air flow additionally causes heat convection between the temperature-controlled pressure medium and the contact pin 12, the heat convection permitting an accelerated temperature control of the contact pin 12 to the temperature level of the pressure medium. Said heat convection extends over the entire longitudinal extent of the individual first air ducts 201, 202, 203 and 204 within the contact pin 12.

Figure 3A:
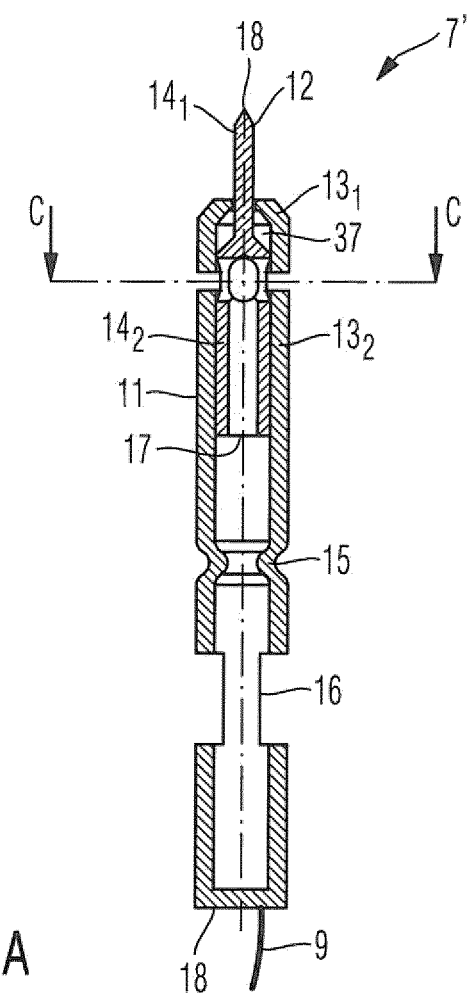
FIG. 3A shows a longitudinal sectional illustration of a second embodiment of a contact module according to the invention.
Figure 3B:
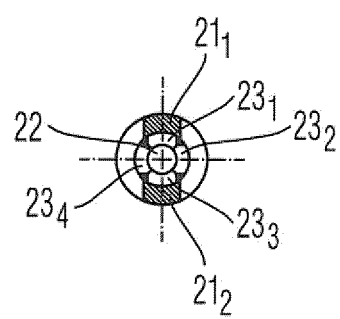
FIG. 3B shows a cross-sectional illustration of a second embodiment of a contact module according to the invention.

FIGS. 3A and 3B illustrate a second embodiment of a contact module 7' according to the invention. Identical features to the first embodiment have identical reference signs and are no longer repeatedly described.

In the second embodiment of the contact module 7' according to the invention, the first air ducts 201, 202, 203 and 204 are realized by a first bore 22, which is common in each case to all of the first air ducts 201, 202, 203 and 204, in the longitudinal direction of the contact pin 12 and by a second bore 221, 222, 223 and 224 in each case in the transverse direction of the contact pin 12.

The common first bore 22 runs in the interior of the contact pin, preferably in the center of the contact pin 12, from that end 17 of the contact pin 12 which faces the pressure chamber over a certain longitudinal extent in the second portion 142 of the contact pin 12. At the end of this longitudinal extent of the first bore 22, a plurality of second bores 231, 232, 233 and 234, which are preferably arranged at equidistant angular portions, lead from the interior to the outer lateral surface of the contact pin 12.

Second air ducts 211 and 212 in the first sleeve 11 between the second portion 132 of the first leadthrough 37 and the exterior space of the pressure chamber 1 are preferably arranged at equidistant angular portions from one another. The number of second air ducts 211 and 212 is likewise reduced in comparison to the number of first air ducts 201, 202, 203 and 204. It is thereby likewise ensured that, at each arbitrary orientation of the contact pin 12 within the first sleeve 11 and at a certain axial position of the contact pin 12 in the associated first sleeve 11, each second air duct 211 and 212 is at least partially connected to at least one second bore 231, 232, 233 and 234 of a first air duct 201, 202, 203 and 204. In this manner, there is likewise at least a number of direct air connections between the pressure chamber 1 and the exterior space of the pressure chamber 1 corresponding to the number of second air ducts 211 and 212.

The second bores 231, 232, 233 and 234 preferably each have an elliptical cross-sectional profile, wherein the longer axis of the elliptical cross-sectional profile extends in the longitudinal direction of the contact pin 12 and the shorter axis of the elliptical cross-sectional profile extends in the circumferential direction of the contact pin 12.

It is thereby ensured that, at different axial positions of the contact pin 12 within the first sleeve 11 in the event of different distances of the contact points, which are to be contacted, from the contact system, an air connection is always realized in each case between each second air duct 211 and 212 and in each case at least one second bore 231, 232, 233 and 234 of a first air duct 201, 202, 203 and 204.

A third embodiment of a contact module 7″ according to the invention with a contact pin and a contact socket for contact connection with a coaxial contact on the housing of the integrated circuit is explained below with reference to FIGS. 4A, 4B and 4C:

The features relating to the contact pin 12 and the associated first sleeve 11 correspond to the features of the embodiments, presented in each of FIGS. 2A, 2B, 3A and 3B, of a contact module according to the invention for making contact with a single contact point on the housing of the integrated circuit and are not explained repeatedly below.

An insulator part 24 and a second leadthrough 25 are arranged coaxially with respect to the first sleeve 11. The second leadthrough 25 is designed here as a sleeve-shaped intermediate space between a second sleeve 26 and the insulator part 24. A contact socket 28 is guided in an axially movable manner in the second leadthrough 25.

In a first portion 271 of the second leadthrough 25, which portion faces away from the pressure chamber 1, the second sleeve 26, in a preferred formation, has a first inner diameter and, in a second portion 272 of the second leadthrough 25, which portion faces the pressure chamber 1, has a second inner diameter which is larger than the first inner diameter.

This contact socket 28 has a first portion 291 facing away from the pressure chamber 1 and a second portion 292 adjoining the first portion 291. The outer diameter of the first portion 291 is smaller than the outer diameter of the second portion 292.

The outer diameter of the second portion 292 of the contact socket 28 corresponds to the inner diameter of the second sleeve 26 in the second portion 272 of the second leadthrough 25. In the variant, illustrated in FIGS. 4A, 4B and 4C, of a contact module 7″ according to the invention, the outer diameter of the first portion 291 of the contact socket 28 corresponds to the inner diameter of the second sleeve 26 in the first portion 271 of the second leadthrough 25.

On the level with the openings 16 which are provided in each case in the first sleeve 11, i.e. in a partial portion of the contact module 7″, which partial portion is located within the pressure chamber 1, openings 30 are also provided in the second sleeve 26. The number of openings 16 in the first sleeve 11 preferably corresponds to the number of openings 30 in the second sleeve 26. In addition, the openings 30 in the first sleeve 26 are preferably arranged in a same phase position as the openings 16 in the first sleeve 11 in order to guide the pressure medium, which is located in the pressure chamber 1, in the same manner to that end 17 of the contact pin 12 which faces the pressure chamber 1 and to that end 31 of the contact socket 28 which faces the pressure chamber 1.

The insulator part 24 extends in the longitudinal direction of the first leadthrough 37 and of the second leadthrough 25 from the openings 16 in the first sleeve 11 as far as the second air ducts 211 and 212 through the first sleeve 11 in the region of the second portion 132 of the first leadthrough 37. Only in the region between the openings 16 of the first sleeve 11 or the openings 30 of the second sleeve 26 and that end 31 of the contact socket 28 which faces the pressure chamber 1 does the insulator part 24, as emerges from FIG. 4B, extend in the transverse direction between first and second sleeve 11 and 26 in order to support first and second sleeve 11 and 26 with respect to each other.

So that a pressure medium can pass from the pressure chamber 1 via the openings 30 in the second sleeve 26 to that end 31 of the contact socket 28 which faces the pressure chamber, a plurality of passages 321, 322, 323 and 324, which are preferably in each case arranged at equidistant angular portions, are provided in the insulator part 24 in the region between the openings 30 of the second sleeve 26 and that end 31 of the contact socket 28 which faces the pressure chamber 1. Said passages 321, 322, 323 and 324 are preferably designed as slots. Alternatively, other cross-sectional profiles for the passages 321, 322, 323 and 324 can be realized. The number of passages 321, 322, 323 and 324 should be suitably selected.

Likewise analogously as in the case of the contact pin 12, a cavity with compressible air is formed between the inner wall of the second sleeve 26 in the second portion 272 of the second leadthrough 25, the outer cylinder outer lateral surface of the first portion 291 of the contact socket 28, that end surface of the second sleeve 26 which faces the pressure chamber, in the transition between the first and second portion of the second leadthrough 25, and that end surface of the second portion 292 of the contact socket 28 which faces away from the pressure chamber. The compressibility of the air here realizes the damping effect of a spiral spring which, according to the invention, is not required for the contact socket 28.

Figure 4A:
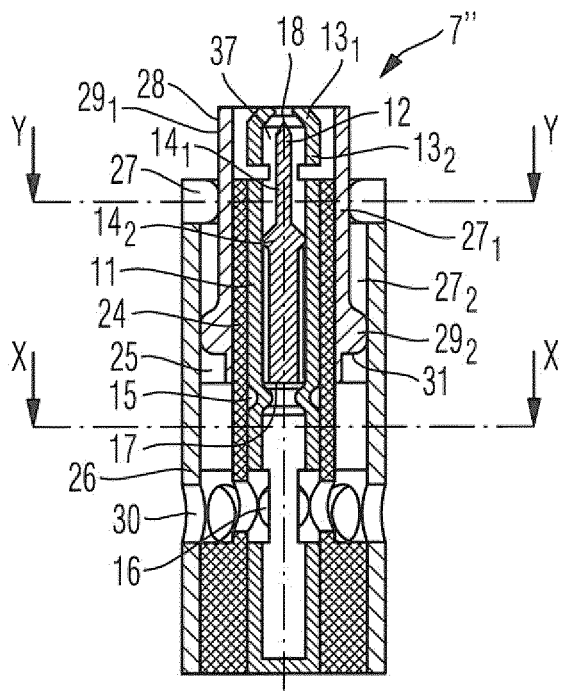
FIG. 4A shows a longitudinal sectional illustration of a coaxial embodiment of a contact module according to the invention.
Figure 4B:
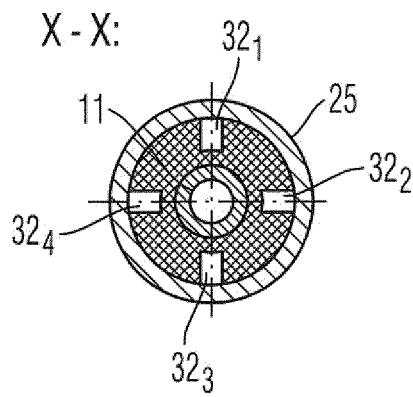
FIG. 4B,4C show cross-sectional illustrations of a coaxial embodiment of a contact module according to the invention.
Figure 4C:
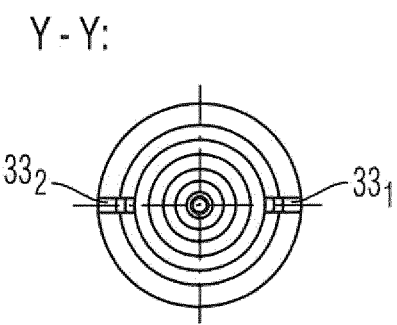

An escape of the air located in the cavity into the exterior space of the pressure chamber 1 during an additional axial movement of the contact socket 28 in the direction of the contact point, to be made contact with, on the housing of the integrated circuit is implemented, as illustrated in FIG. 4C, via at least one passage 331, preferably a plurality of passages 331 and 332, in the second sleeve 26 in the region of the first portion 271 of the second leadthrough 25. Said passages 331 and 332 can preferably be of slot-shaped design. Alternatively, an escape of the air located in the cavity into the exterior space of the pressure chamber 1 can also be realized via a passage which is formed by an inner diameter of the second sleeve 26 in the region of the first portion 271 of the second leadthrough 25, said inner diameter being smaller than the outer diameter of the first portion 291 of the contact socket 28.

In a further embodiment, the second sleeve 26 is restricted to the second portion 272 of the second leadthrough 25. A separate third sleeve is provided in the region of the first portion 271 of the second leadthrough 25, said third sleeve having the same geometry and the same formations as have been mentioned above for the second sleeve 26 in the region of the first portion 271 of the second leadthrough 25. The third sleeve is connected here to the second sleeve 26 and/or to the inner wall of the respective throughbore 61, 62 and 63 in the housing 2 of the pressure chamber 1 by means of an interference fit, adhesive bonding or screwing.

Temperature control of the contact socket 28 to the temperature level of the pressure chamber 1 takes place, firstly, by means of heat transfer from the pressure medium within the second sleeve 26 to the contact socket 28 at that end 31 of the contact socket 28 which faces the pressure chamber. On the other hand, the contact socket 28 is additionally temperature-controlled by means of air flows which are guided through the individual first air ducts 201, 202, 203 and 204 of the contact pin 12 and through the second air ducts 211 and 212 through the first sleeve 11 and are conducted along the inner wall of the first portion 291 of the contact socket 28.

A second embodiment of a contact system 100' according to the invention is described below with reference to FIG. 5:

In the housing 2 of the pressure chamber 1, a through-bore 61', 62' and 63' is in each case provided for each contact pin 121, 122 and 123, the interior space of which throughbore serves in each case as a further embodiment of a first leadthrough 37' for the associated contact pin 121, 122 and 123. Each of said first leadthroughs 37', i.e. each interior space of a throughbore 61', 62' and 63', in each case has a first portion 131' which faces away from the pressure chamber and has a smaller inner diameter and a second portion 132' which faces the pressure chamber and has a larger inner diameter.

Each throughbore 61', 62' and 63' can therefore firstly be realized as a stepped throughbore.

Figure 5:
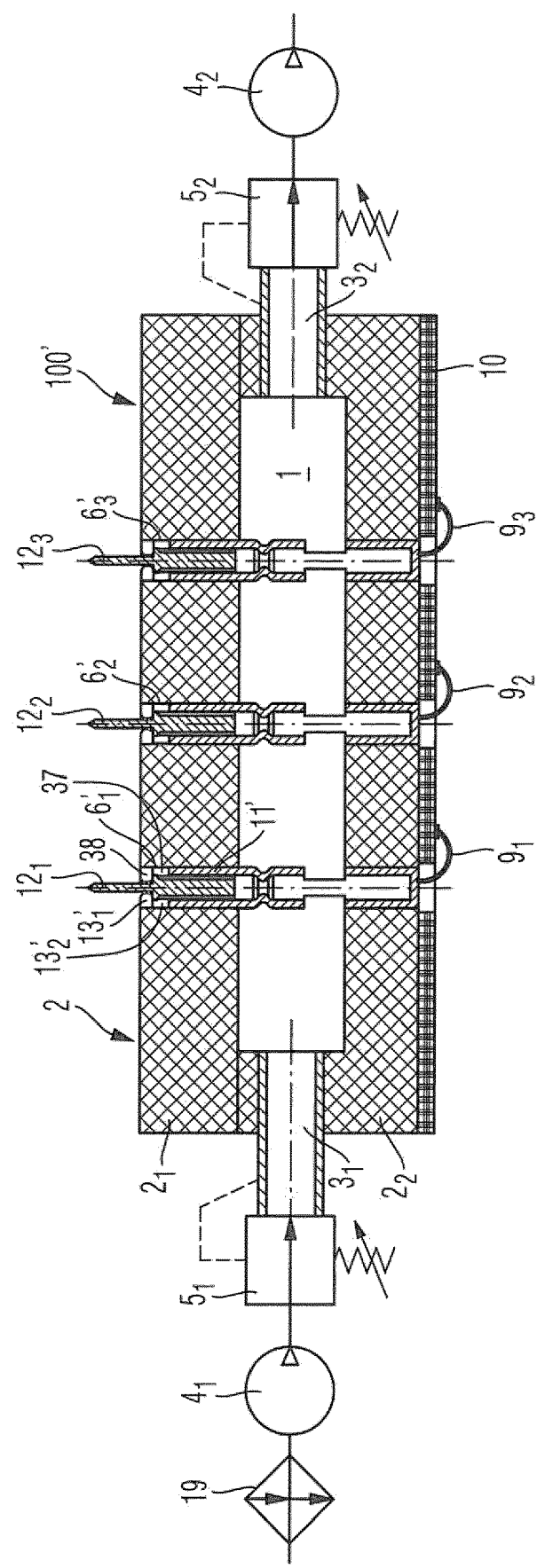
FIG. 5 shows a sectional illustration of a further embodiment of a contact system according to the invention.

Another realization, as illustrated in FIG. 5, contains a throughbore having in each case a larger inner diameter, corresponding to the inner diameter of the second portion 132' of the first leadthrough 37', and in each case a third sleeve 38 having a smaller inner diameter, corresponding to the inner diameter of the first portion 131' of the first leadthrough 37'. The third sleeve 38 is fixed in a precisely fitting manner at the throughbore at that end of the respective throughbore which faces away from the pressure chamber. The third sleeve 38 is fixed at the respective throughbore, for example, by means of an interference fit, adhesive bonding or screwing.

A partial portion of a second embodiment of a first sleeve 11' is fixed in a precisely fitting manner in a partial portion, which faces the pressure chamber, of the second portion 132' of the first leadthrough 37', i.e. of the throughbore. The second embodiment of the first sleeve 11' is a sleeve which is open in the direction of the housing of the integrated circuit to be tested, and corresponds in the direction of the pressure chamber 1 to the first embodiment of the first sleeve 11. Analogously to the first embodiment of the first sleeve 11, the contact pin 12 is guided in an axially movable manner in the first sleeve 11'.

The interior space of the third sleeve 38 therefore forms the first portion 131' of the first leadthrough 37', which portion provides an outlet for the contact pin 12 for the contact connection with a contact point on the housing of an integrated circuit. That partial portion of the throughbore which is not taken up by the third sleeve 38, and the interior space of the first sleeve 11' together form the second portion 132' of the first leadthrough 37', in which portion the contact pin 121, 122 and 123 is guided in an axially movable manner.

Each contact pin 121, 122 and 123 in each case has a plurality of first air ducts 201, 202, 203 and 204 which are each realized as a recess on the cylinder lateral outer surface of the second portion 142 of the respective contact pin 121, 122 and 123 over a certain longitudinal extent from the end 17 facing the pressure chamber. At their end facing away from the pressure chamber, said recesses are in each case of conical or frustoconical design. Air flows through the first air ducts 201, 202, 203 and 204 flow uniformly through second air ducts which are realized as passages in the third sleeve 38. These passages in the third sleeve 38 are formed equivalently to the passages 331 and 332, which are illustrated in FIG. 4C, in the second sleeve 26 in the region of the first portion 271 of the second leadthrough 25. In this manner, firstly, centring of the respective contact pin 121, 122 and 123 in the first leadthrough 37' is realized. Secondly, an accelerated temperature control of the respective contact pin 121, 122 and 123 to the temperature level of the pressure medium is realized via heat convection.

Figure 6A:
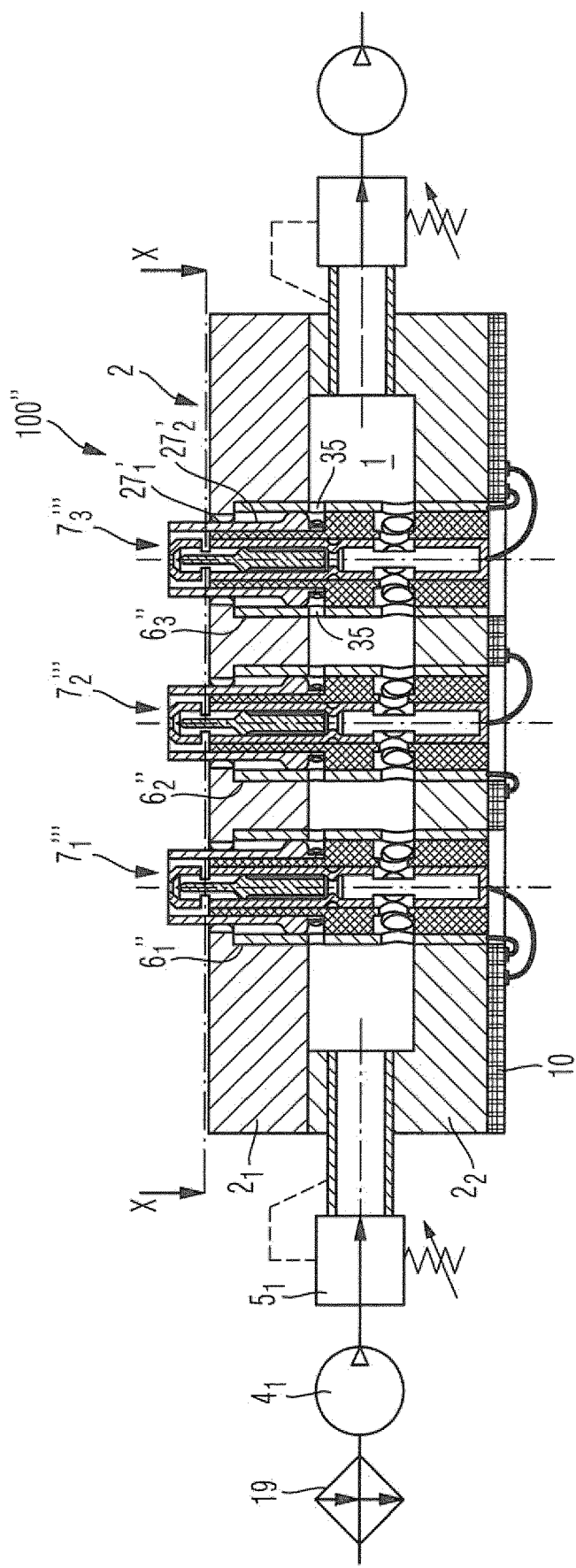
FIG. 6A shows a sectional illustration of a coaxial embodiment of a contact system according to the invention.
Figure 6B:
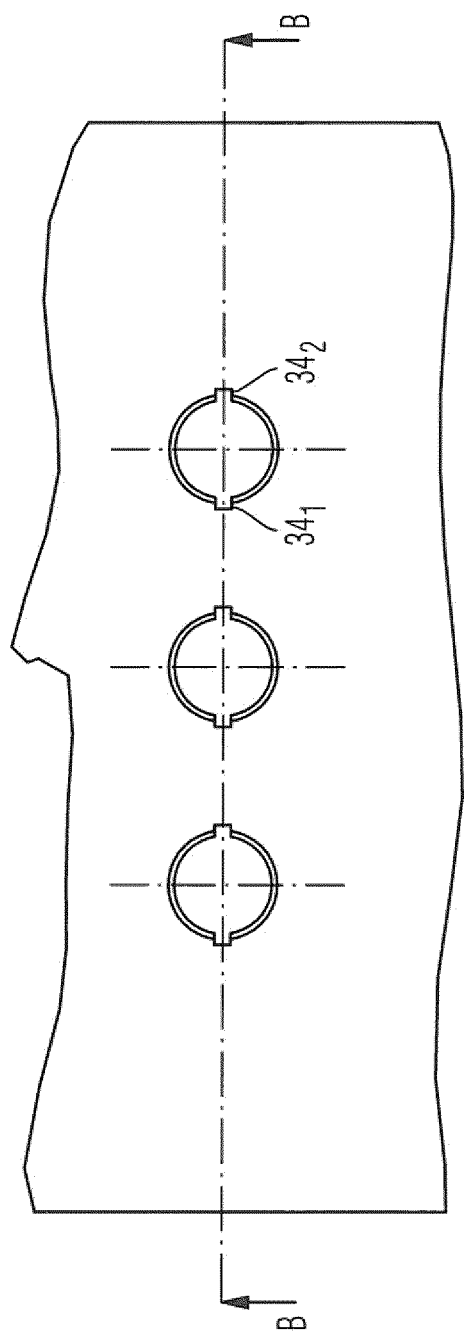
FIG. 6B,6C show a top view and a sectional illustration of a housing plate for a coaxial embodiment of a contact system according to the invention.
Figure 6C:
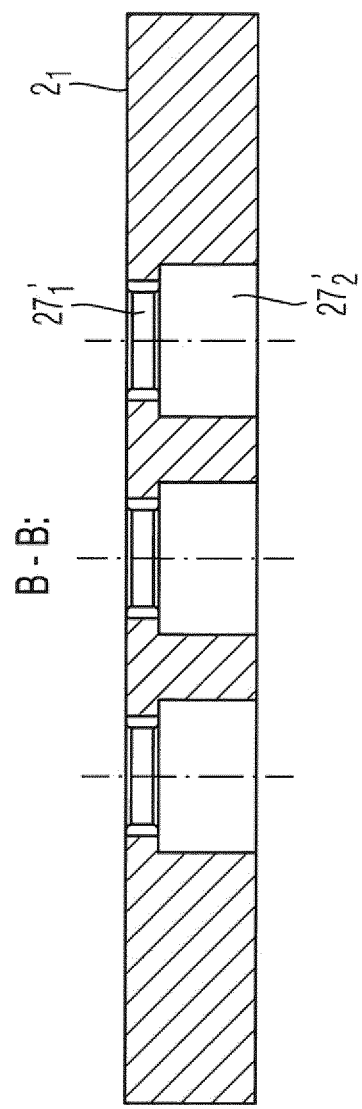

FIGS. 6A, 6B, and 6C illustrate a third embodiment of a contact system 100" according to the invention. In the housing 2 of the pressure chamber 1, a first throughbore 61", 62" and 63" is provided in each case for each contact module 71''', 72''' and 73''', said throughbores corresponding structurally to the first throughbore 61', 62' and 63' presented in the second embodiment of the contact system 100" according to the invention. Since the first throughbores 61", 62" and 63" of the third embodiment of the contact system 100" according to the invention are used for contact modules 71''', 72''' and 73''' consisting in each case of a contact pin and a contact socket and therefore only have a larger diameter, a detailed repeated description is dispensed with at this juncture and reference is made to the corresponding description of the first throughbores 61', 62' and 63' in the second embodiment of the contact system 100" according to the invention. The outer wiring of the pressure chamber 1 also does not change in the third embodiment in comparison to the first and second embodiment of the contact system according to the invention, and therefore a detailed description is also dispensed with here and reference is made in this regard to the description for the first and second embodiments.

The third embodiment of a contact module 71''', 72''' and 73''' which is used in the third embodiment of the contact system 100" according to the invention and has a contact pin and a contact socket in each case is similar to the second embodiment of a contact module 7" according to FIGS. 4A to 4C, and therefore only the differences are explained below:

Each contact module 71''', 72''' and 73''' of the third embodiment is fixed in a precisely fitting manner in an associated stepped throughbore 61", 62" and 63".

The intermediate space between the stepped throughbore 61", 62" and 63" and the insulator part 24 of the associated contact module 71''', 72''' and 73''' forms a second leadthrough 25' here. According to FIG. 6C, this second leadthrough 25' has a first portion 271' which faces away from the pressure chamber and has a first inner diameter, and a second portion 272' which faces the pressure chamber and has a second inner diameter which is larger than the first inner diameter.

According to FIG. 6B, a plurality of recesses 341 and 342 which are preferably arranged at equidistant angular portions and run in the longitudinal direction of the second leadthrough are provided in the cylinder inner wall of the stepped throughbores 61", 62" and 63" in the region of the first portion 271' of the second leadthrough 25'. Said recesses permit an escape of the air located in the cavity between the second sleeve 26, the first portion 291 of the contact socket 28, that end surface of the second portion 292 of the contact socket 28 which faces away from the pressure chamber and that end surface of the respective stepped throughbore 61", 62" and 63" which faces the pressure chamber, in the transition between the first and the second portion of the second leadthrough 25', into the exterior space of the pressure chamber 1.

The second sleeve 26 of each contact module 71''', 72''' and 73''' is fitted here completely into the stepped throughbore 61''', 62''' and 63''' in the region of the second portion 272' of the second leadthrough 25'.

The contact socket 28 is movable axially in the associated second leadthrough 25'.

In the third embodiment of the contact module 71''', 72''' and 73''' according to the invention, in addition to the openings 30 in the direction of the contact socket 28, additional openings 35 are provided in the second sleeve 26. Said additional openings 35 permit the use of an insulator part 24, and therefore passages 321, 322, 323 and 324 are not required in the region for mutual support of the first and second sleeve 11 and 26.

The remaining features of the third embodiment of the contact module 71''', 72''' and 73''' according to the invention correspond to the second embodiment of the contact module 7" according to the invention and are therefore not explained in more detail at this juncture.

At this juncture, it should be pointed out that, in the case of such an embodiment of a contact system according to the invention with coaxial contact connection, the housing 2 should not only be formed from an electrically insulating material, but preferably also from an electrically conductive material. In the case of such a selection of material, a common earth potential for the individual contact socket can be realized via the entire housing 2.

Figure 7:
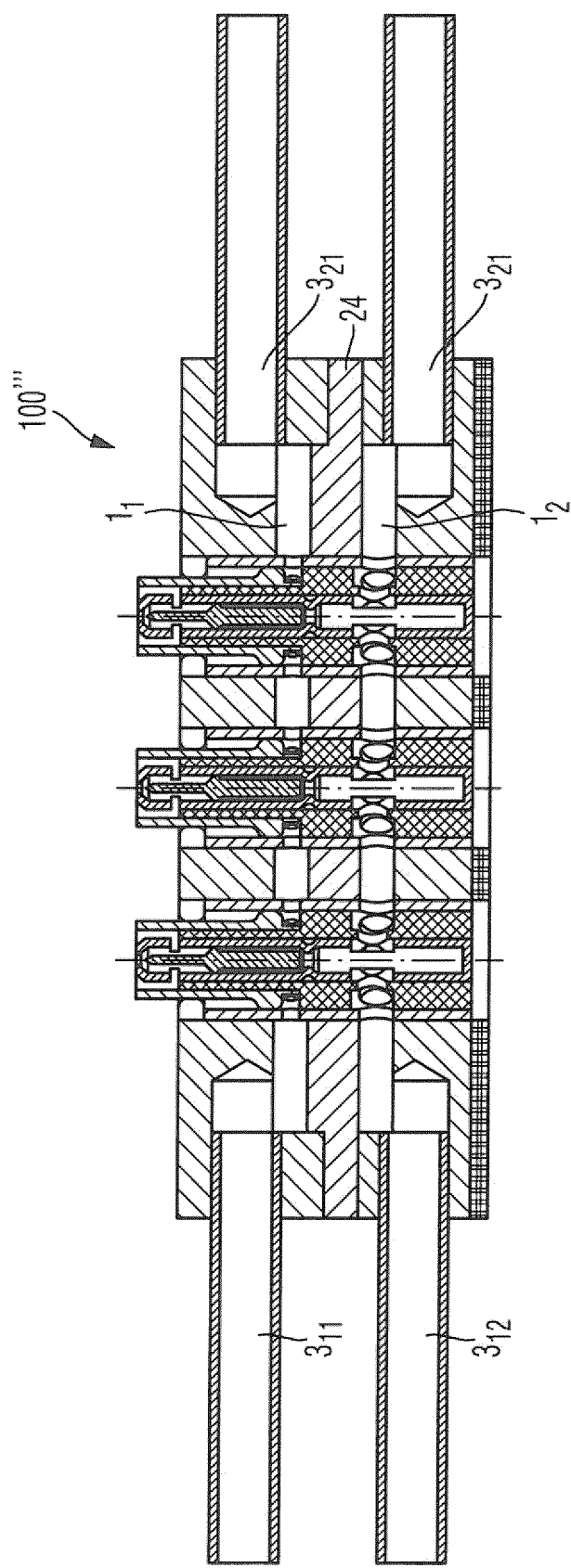
FIG. 7 shows a sectional illustration of a further embodiment of a contact system according to the invention.

FIG. 7 illustrates a further embodiment 100''' of a contact system according to the invention which can be used for coaxially designed contact modules 7" according to FIGS. 4A to 4C. Alternatively, this further embodiment 100''' of a contact system according to the invention is also usable for a coaxial contact connection, as is illustrated in FIGS. 6A to 6C.

The pressure chamber 1 is divided here into two pressure chambers 11 and 12 by the interconnection of a further housing plate 24. For this purpose, the further housing plate 24 in each case has a suitably dimensioned and positioned bore for each coaxial contact module 7". Each pressure chamber 11 and 12 in each case has a separate first and second inlet 311 and 321, and 312 and 322, respectively, for the supply and removal of a pressure medium.

In this manner, a specific pressure level for the pressure medium can be set in each case in each pressure chamber 11 and 12. The individual contact pins can therefore be pressed onto the contact points on the housing of the integrated circuit to be tested with a different contact pressure than the associated contact sockets. This is required in particular if the contact pins, because of heavy oxidation phenomena on the associated contact points, require a higher contact pressure for breaking up the oxidation layers.

Although the present invention has been fully described above with reference to preferred exemplary embodiments, it is not restricted thereto but rather can be modified in diverse ways.

LIST OF REFERENCE SIGNS

1 Pressure chamber
2 Housing
21, 22 Upper and lower housing plate
31, 32 First and second inlet
41, 42 Pneumatic pump
51, 52 Pressure control valve
61, 62, 63 First throughbore
61', 62', 63' First throughbore
7, 71, 72, 73 First embodiment of a contact module
7' Second embodiment of a contact module
7" Third embodiment of a contact module
81, 82, 83 Second embodiment of a contact module
91, 92, 93 Signal lines
10 Printed circuit board
11 First sleeve
12, 121, 122, 123 Contact pins
131, 132 First and second portion of a first embodiment of a first leadthrough
131', 132' First and second portion of a second embodiment of a first leadthrough
141, 142 First and second portion of a contact pin
15 Shoulder
16 Opening
17 End of the contact pin facing the pressure chamber
18 Test probe
19 Temperature controller
201, 202, 203 First air ducts
211, 212 Second air ducts
22 First bore
231, 232, 233 Second bore
24 Insulating part
25 First embodiment of a second leadthrough
25' Second embodiment of a second leadthrough
26 Second sleeve
271, 272 First and second portion of a first embodiment of a second leadthrough
271', 272' First and second portion of a second embodiment of a second leadthrough
28 Contact socket
291, 292 First and second portion of the contact socket
30 Openings
31 End of the contact socket facing the pressure chamber
321, 322, 323 Passages in the insulator part
331, 332 Passages in the second sleeve in the region of the first portion of the second leadthrough
341, 342 Recesses in the stepped throughbores in the region of the first portion of the second leadthrough
35 Additional openings
36 End of the contact pin remote from the test probe
37 First embodiment of a first leadthrough
37' Second embodiment of a first leadthrough
38 Third sleeve
200 Housing of the integrated circuit
2011, 2012, 2013 Contact points on the housing of the integrated circuit

The invention claimed is:

1. A contact system, comprising:
a housing; and
a first contact pin movable, in response to a pressurization of a medium, from a first position to a second position in a direction substantially parallel to a first longitudinal axis of said first contact pin;
a sleeve that guides said first contact pin from said first position to said second position; and
a temperature control system that adjusts a temperature of said medium, wherein
said sleeve comprises a first opening in a first region in an interior of said housing and a second opening in a second region exterior of said housing, and said first contact pin comprises a passage that permits a flow of said medium from an interior of said housing via said first opening, said passage and said second opening to an exterior of said housing.

2. The contact system of claim 1, comprising:
a second contact pin having a second longitudinal axis substantially parallel to said first longitudinal axis, wherein
said second contact pin is movable, in response to said pressurization of said medium, substantially parallel to said first contact pin.

3. The contact system of claim 1, wherein:
said first contact pin comprises a tip region and a second region, an outer diameter of said tip region being smaller than an outer diameter of said second region.

4. The contact system of claim 1, comprising:
a groove on an outer circumference of said first contact pin.

5. The contact system of claim 4, comprising:
a bore along a central longitudinal axis of said first contact pin.

6. The contact system of claim 1, comprising:
a groove on an outer circumference of said first contact pin, said groove constituting at least a portion of said passage.

7. The contact system of claim 1, comprising:
a bore along a central longitudinal axis of said first contact pin, said bore constituting at least a portion of said passage.

8. The contact system of claim 1, wherein:
said first contact pin cooperates with a portion of said sleeve proximate to a tip of said first contact pin to at least partially entrap air that dampens a motion of said first contact pin.

9. The contact system of claim 1, wherein:
said temperature control system receives an input indicative of a desired temperature and adjusts said temperature of said medium toward said desired temperature.

10. An integrated circuit measurement method, comprising:
positioning an integrated circuit adjacent to a contact system,
pressurizing a medium from a first pressure to a second pressure higher than said first pressure,
heating said integrated circuit, and
altering a temperature of said medium from a first temperature to a second temperature that is closer to a temperature of said heated integrated circuit than said first temperature, wherein
said contact system comprises a first contact pin that, in response to said pressurizing of said medium, moves from a first position to a second position in a direction substantially parallel to a first longitudinal axis of said first contact pin.

11. The measurement method of claim 10, wherein:
said contact system comprises a second contact pin having a second longitudinal axis substantially parallel to said first longitudinal axis, wherein
said second contact pin, in response to said pressurizing of said medium, moves substantially parallel to said first contact pin.

12. The measurement method of claim 10, wherein:
said first contact pin, in said second position, contacts an input/output terminal of said integrated circuit, and
said first contact pin, in said first position, does not contact said input/output terminal.

13. An integrated circuit measurement method, comprising:
positioning an integrated circuit adjacent to a contact system,
pressurizing a medium from a first pressure to a second pressure higher than said first pressure,
heating said medium, and
altering a temperature of said integrated circuit from a first temperature to a second temperature that is closer to a temperature of said heated medium than said first temperature, wherein
said contact system comprises a first contact pin that, in response to said pressurizing of said medium, moves from a first position to a second position in a direction substantially parallel to a first longitudinal axis of said first contact pin.

14. The measurement method of claim 13, wherein:
said contact system comprises a second contact pin having a second longitudinal axis substantially parallel to said first longitudinal axis, wherein
said second contact pin, in response to said pressurizing of said medium, moves substantially parallel to said first contact pin.

15. The measurement method of claim 13, wherein:
said first contact pin, in said second position, contacts an input/output terminal of said integrated circuit, and
said first contact pin, in said first position, does not contact said input/output terminal.

16. A contact system, comprising:
a first contact pin movable, in response to a pressurization of a medium, from a first position to a second position in a direction substantially parallel to a first longitudinal axis of said first contact pin;
a second contact pin movable in response to said pressurization of said medium; and
a temperature control system that adjusts a temperature of said medium, wherein said temperature control system receives an input indicative of a desired temperature and adjusts said temperature of said medium toward said desired temperature, wherein
said second contact pin is electrically insulated from said first contact pin.

17. A contact system, comprising:
a first contact pin movable, in response to a pressurization of a medium, from a first position to a second position in a direction substantially parallel to a first longitudinal axis of said first contact pin;
a temperature control system that adjusts a temperature of said medium; and
a sleeve that guides said first contact pin from said first position to said second position, wherein
said first contact pin cooperates with a portion of said sleeve proximate to a tip of said first contact pin to at least partially entrap air that dampens a motion of said first contact pin.

18. The contact system of claim 16, wherein:
said second contact pin is movable, in response to said pressurization of said medium, in a direction substantially parallel to said first longitudinal axis.

19. The contact system of claim 16, comprising:
a housing of an electrically insulating material, wherein
said first contact pin is movably mounted in a first opening in a wall of said housing,
said second contact pin is movably mounted in a second opening in said wall of said housing.

20. The contact system of claim 19, wherein:
said housing defines a passage for said medium, and
said wall defines a wall of said passage.

\* \* \* \* \*